(12) United States Patent
Ho et al.

(10) Patent No.: US 9,288,914 B2
(45) Date of Patent: Mar. 15, 2016

(54) METHOD OF MANUFACTURING A PRINTED CIRCUIT BOARD WITH CIRCUIT VISIBLE

(71) Applicants: FuKui Precision Component (Shenzhen) Co., Ltd., Shenzhen (CN); Zhen Ding Technology Co., Ltd., Tayuan, Taoyuan (TW)

(72) Inventors: Ming-Jaan Ho, New Taipei (TW); Xian-Qin Hu, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/082,196

(22) Filed: Nov. 18, 2013

(65) Prior Publication Data

US 2014/0144685 A1     May 29, 2014

(30) Foreign Application Priority Data

Nov. 28, 2012   (CN) .......................... 2012 1 0494114

(51) Int. Cl.
*H05K 3/44*   (2006.01)
*H05K 3/28*   (2006.01)
*H05K 3/20*   (2006.01)
*H05K 1/11*   (2006.01)

(52) U.S. Cl.
CPC *H05K 3/281* (2013.01); *H05K 1/11* (2013.01); *H05K 3/202* (2013.01); *H05K 2201/0145* (2013.01); *H05K 2203/063* (2013.01); *H05K 2203/068* (2013.01); *Y10T 29/302* (2015.01)

(58) Field of Classification Search
CPC ........... H05K 1/03; H05K 1/036; H05K 1/11; H05K 1/113; H05K 1/144; H05K 3/202; H05K 3/281; H05K 2203/063; H05K 2203/068; Y10T 29/302
See application file for complete search history.

(56) References Cited

U.S. PATENT DOCUMENTS

| | | | | |
|---|---|---|---|---|
| 5,473,120 A * | 12/1995 | Ito et al. | ......................... | 174/264 |
| 6,531,661 B2 * | 3/2003 | Uchikawa et al. | ............. | 174/255 |
| 6,767,616 B2 * | 7/2004 | Ooi et al. | ........................ | 428/209 |
| 7,102,085 B2 * | 9/2006 | Ohta et al. | ..................... | 174/260 |
| 7,371,974 B2 * | 5/2008 | Toyoda et al. | ................ | 174/262 |
| 7,446,263 B2 * | 11/2008 | En | .................................. | 174/262 |
| 7,726,016 B2 * | 6/2010 | Ohsumi et al. | ................... | 29/852 |
| 8,058,568 B2 * | 11/2011 | Chang | ........................... | 174/264 |

* cited by examiner

*Primary Examiner* — Carl Arbes
(74) *Attorney, Agent, or Firm* — Novak Druce Connolly Bove + Quigg LLP

(57) ABSTRACT

A printed circuit board with circuit visible includes a wiring layer, a first adhesive layer, a first dielectric layer, and a cover film, which are stacked in described order, the wiring layer comprising at least one electrical contact pad. The cover film has at least one opening corresponding to the electrical contact pad. The cover film includes a second dielectric layer and a second adhesive layer. A flow initiation temperature of the first adhesive layer is in a range from 85 degrees centigrade to 90 degrees centigrade, and a hardening temperature of the first adhesive being lower than 150 degrees centigrade.

8 Claims, 7 Drawing Sheets

METHOD OF MANUFACTURING A PRINTED CIRCUIT BOARD WITH CIRCUIT VISIBLE

BACKGROUND

1. Technical Field

The present disclosure generally relates to circuit boards, and particularly to a printed circuit board with circuit visible, and a method for manufacturing the printed circuit board with circuit visible.

2. Description of Related Art

To accommodate development of miniaturized electronic products with multiple functions, printed circuit boards are widely used.

Currently, there is a printed circuit board with circuit visible having a transparent substrate for supporting and protecting wiring layers from being damaged, and a transparent solder mask. In a method from manufacturing the printed circuit board with circuit visible, it is needed to laminate a cover film onto a circuit substrate having wiring layers to protect the wiring layers from being damaged. However, because the lamination is completed under the help of high temperature and high pressure force, an etiolating phenomenon occur in a adhesive layer of the circuit board and a adhesive layer of the cover film due to the high temperature, thereby making the printed circuit board with circuit visible unappealing.

What is needed, therefore, is a printed circuit board with circuit visible, and a method for manufacturing the printed circuit board with circuit visible to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board with circuit visible includes the following steps.

Figure 1:
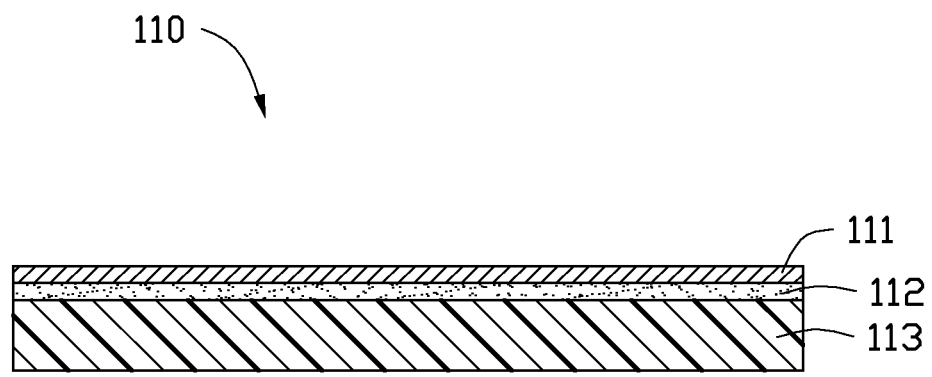
FIG. 1 shows a copper-clad substrate according to an exemplary embodiment.

FIG. 1 shows step 1, in which a copper-clad laminate 110 is provided. In the present embodiment, the copper-clad laminate 110 is a single-sided copper-clad laminate, and includes a copper foil layer 111, a first adhesive layer 112, and a first dielectric layer 113, which are stacked in described order.

The copper foil layer 111 may be an electrolytic copper foil or a rolled copper foil. A thickness of the copper foil layer 111 is in a range from 10 micrometers to 15 micrometers. A material of the first adhesive layer 112 is Epoxy-Acrylate. A flow initiation temperature of the first adhesive layer 112 is in a range from 85 degrees centigrade to 90 degrees centigrade. In other words, when the temperature of the first adhesive layer 112 passes the flow initiation temperature of the first adhesive layer 112, the material of the first adhesive layer 112 flows. A hardening temperature of the first adhesive 112 is lower than 150 degrees centigrade. A material of the first dielectric layer 113 is polyethylene terephthalate. The polyethylene terephthalate not only has better optical property and weather ability, but also has better optical transparent property. A thickness of the first adhesive layer 112 is in a range from 10 micrometers to 15 micrometers. A thickness of the first dielectric layer 113 is in a range from 40 micrometers to 60 micrometers.

Figure 2:
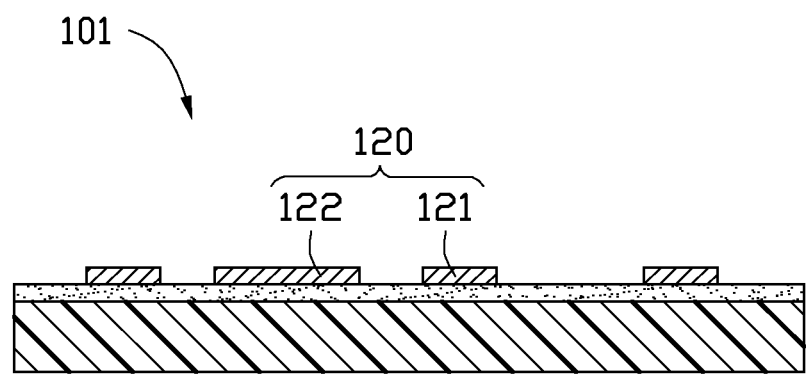
FIG. 2 shows a circuit substrate manufactured from the copper foil-clad substrate of FIG. 1.

FIG. 2 shows step 2, in which a portion of the copper foil layer 111 is selectively removed from the copper-clad substrate 110, thereby obtaining a wiring layer 120. A circuit substrate 101 is thus obtained.

In this step, the portion of the copper foil layer 111 is selectively removed from the copper-clad substrate 110 using an image transfer process and an etching process to obtain the wiring layer 122. The wiring layer 122 includes a plurality of wires 121 and a plurality of electrical contact pads 122. For clearly showing the wiring layer 122, the wiring layer 122 having one electrical contact pad 122 is taken for example.

Figure 3:
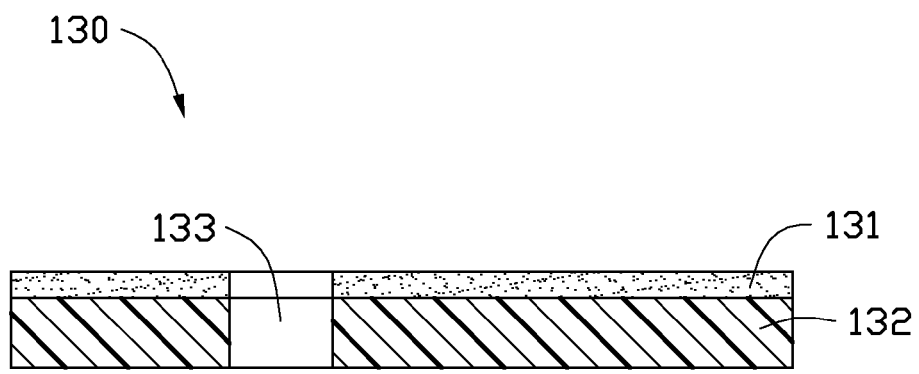
FIG. 3 shows a cover film according to the exemplary embodiment.

FIG. 3 shows step 3, in which a cover film 130 is provided. A plurality of openings 133 spatially corresponding to the electrical contact pads 122 is formed in the cover film 130.

The cover film 130 includes a second adhesive layer 133 and a second dielectric layer 132. A material of the second adhesive layer 133 is Epoxy-Acrylate. A flow initiation temperature of the second adhesive layer 131 is in a range from 85 degrees centigrade to 90 degrees centigrade. In other words, when the temperature of the second adhesive layer 131 passes the flow initiation temperature of the second adhesive layer 131, the second adhesive layer 112 flows. A hardening temperature of the second adhesive 131 is smaller than 150 degrees centigrade. A material of the second dielectric layer 132 is polyethylene terephthalate. A thickness of the second adhesive layer 131 is larger than the thickness of the copper foil layer 111. The thickness of the second adhesive layer 131 is in a range from 12 micrometers to 18 micrometers. A thickness of the second dielectric layer 132 is in a range from 40 micrometers to 60 micrometers.

FIGS. 4 to 7 show step 4, in which the cover film 130 is laminated on the wiring layer 120 of the circuit board 101, thereby obtaining a printed circuit board with circuit visible 100.

Before laminating, the cover film 130 is positioned on the wiring layer 120 using a pre-fit method, such that each electrical contact pad 122 spatially corresponds to one opening 133.

Figure 4:
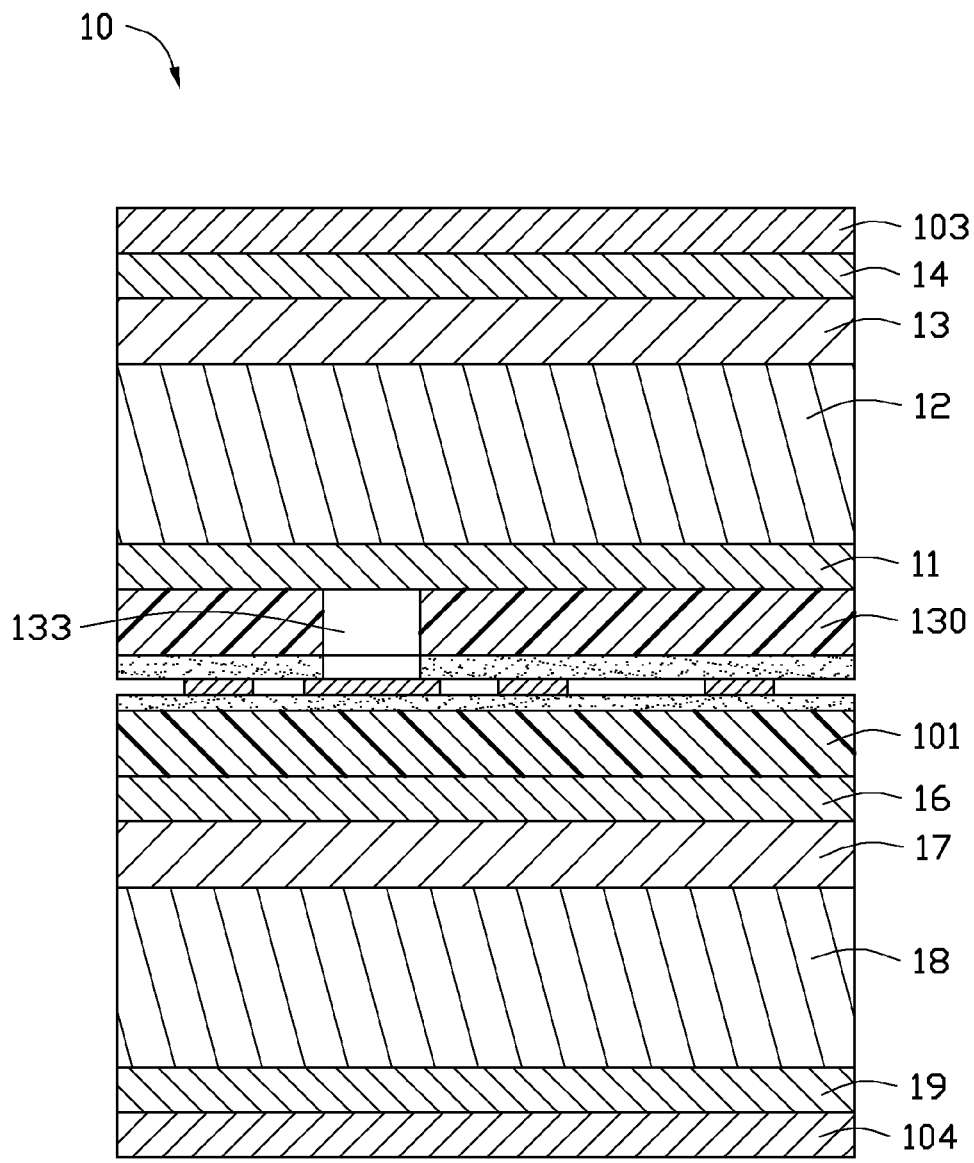
FIG. 4 shows a stacked structure including the circuit substrate and the cover film of FIG. 3.
Figure 5:
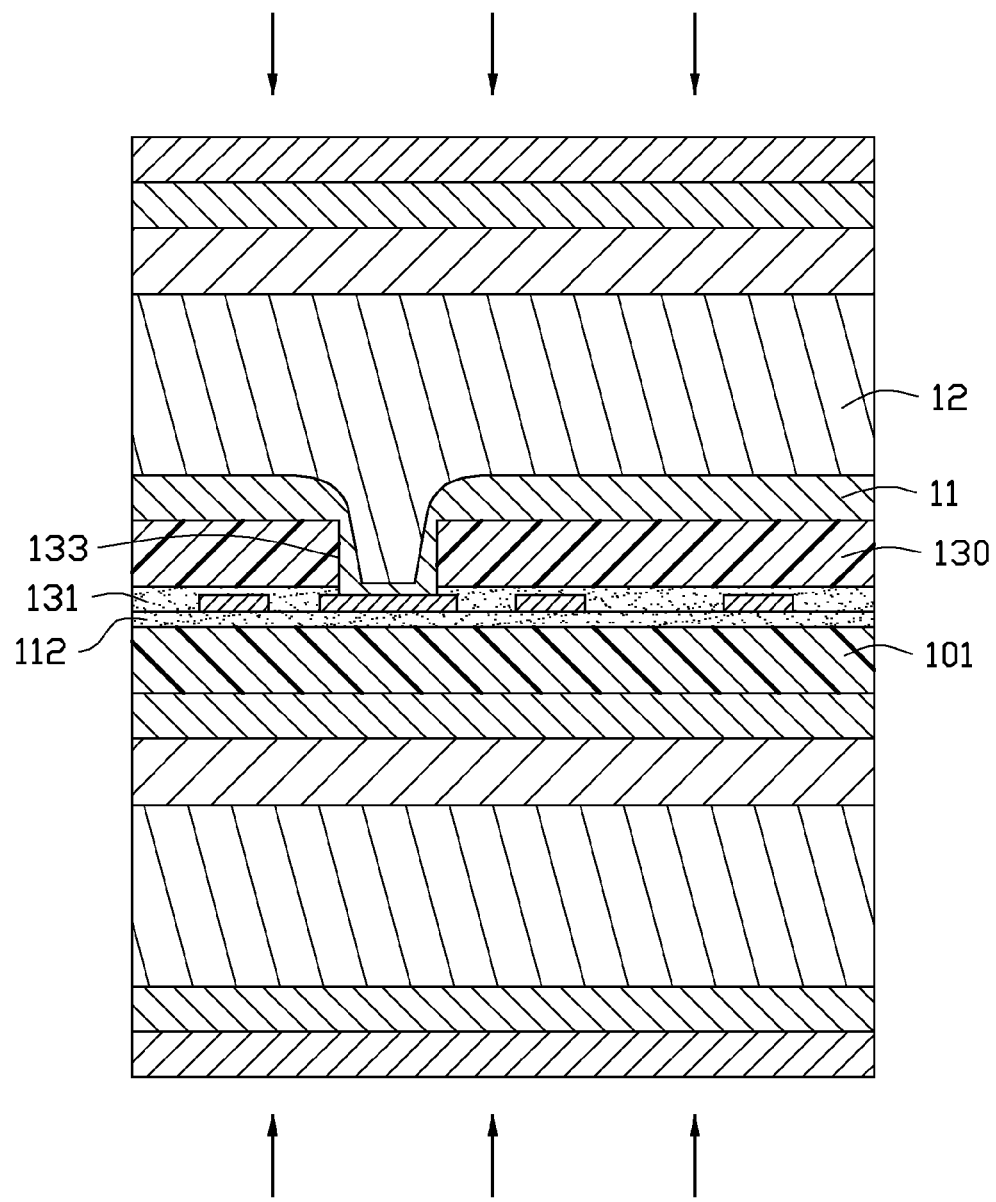
FIG. 5 shows the stacked structure of FIG. 4 after being laminated.
Figure 6:
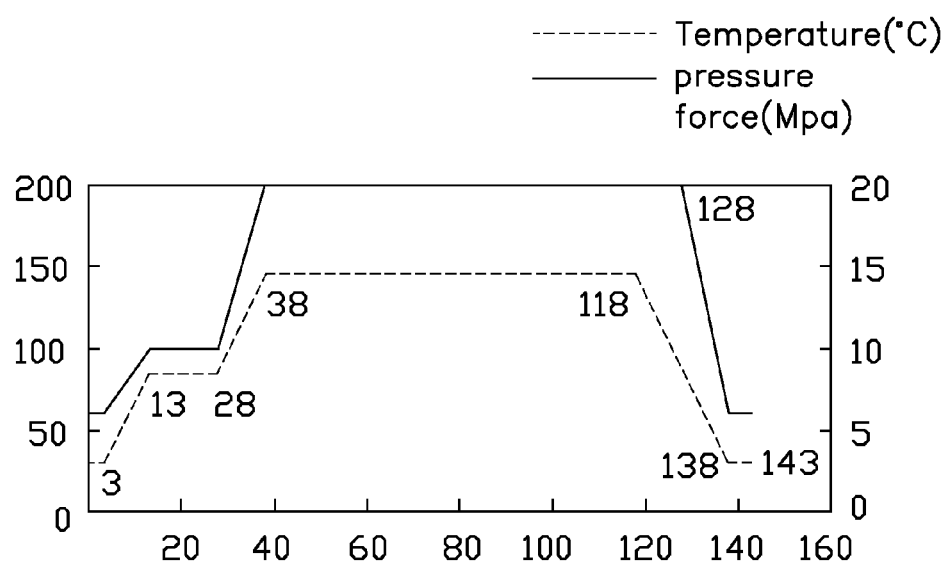
FIG. 6 is a schematic diagram showing a variety of temperature and pressure force with time in the lamination.

Referring to FIGS. 4 to 6, this step may be processed by using a drive press. This step includes the following substeps.

First of all, a plurality of auxiliary substrates is stacked on a side of cover film 130 of the circuit substrate 101, and a plurality of auxiliary substrates are stacked on the other side of the circuit substrate 101 further away from the cover film 130, thereby forming a stacked structure 10.

In detail, a first separate layer 11, a first buffer layer 12, a first support layer 13, a second separate layer 14, and a first steel plate 103 are successively stacked on the side of the cover film 130. The first separate layer 11 is stacked at a surface of the second dielectric layer 132 of the cover film 130. The first separate layer 11 and the second separate layer 14 are release films made of polyethylene terephthalate. A thickness of each of the first separate layer 11 and the second separate layer 11 is smaller than 30 micrometers. In other embodiments, the thickness of each of the first separate layer 11 and the second separate layer 11 is in a range from 20 micrometers to 25 micrometers. The first buffer layer 12 is made of high density polyethylene. A soft temperature of a material of the first buffer layer 12 is lower than 80 degrees centigrade. In other embodiments, the soft temperature of a material of the first buffer layer 12 is in a range from 75 degrees centigrade to 78 degrees centigrade. A thickness of the first buffer layer 12 is larger or equal to 180 micrometers. In other embodiments, the thickness of the first buffer layer 12 is in a range form 180 micrometers to 200 micrometers. The first support layer 13 is also made of polyethylene terephthalate. A thickness of the first support layer 13 is in a range from 40 micrometers to 40 micrometers 60. In the present embodiment, the thickness of the first support layer 13 is 50 micrometers.

A third separate layer 16, a second support layer 17, a second buffer layer 18, a fourth separate layer 19, and a second steel plate 103 are successively stacked at the side of the circuit substrate 101 further away from the cover film 130. The third separate layer 16 is stacked at a surface of the first dielectric layer 113 of the circuit substrate 101. The third separate layer 16 and the fourth separate layer 19 are made of polyethylene terephthalate. A thickness of each of the third separate layer 16 and the fourth separate layer 19 is smaller than 30 micrometers. In other embodiments, the thickness of each of the third separate layer 16 and the fourth separate layer 19 is in a range from 20 micrometers to 25 micrometers. The second buffer layer 18 is made of high density polyethylene. A soft temperature of a material of the second buffer layer 18 is lower than 80 degrees centigrade. In other embodiments, the soft temperature of a material of the second buffer layer 18 is in a range from 75 degrees centigrade to 78 degrees centigrade. A thickness of the second buffer layer 18 is larger or equal to 180 micrometers. In other embodiments, the thickness of the second buffer layer 18 is in a range form 180 micrometers to 200 micrometers. The second support layer 17 is also made of polyethylene terephthalate. A thickness of the second support layer 17 is in a range from 40 micrometers to 40 micrometers 60. In the present embodiment, the thickness of the second support layer 13 is 50 micrometers.

Then, the stacked structure 10 is positioned into the drive press to press the first steel plate 103 and the second steel plate 104, and the temperature of the stacked structure 10 is higher, such that the cover film 130 and the circuit substrate 101 is laminated onto each other.

When lamination, the temperature and the pressure force are controlled. In the present embodiment, a maximum value of the temperature in a heating process is smaller than 150 degrees centigrade, and a maximum value of the pressure force in the heating process is 20 Mpa. FIG. 6 shows, the process of a variety of the temperature and the pressure force. In detail, in a first three minutes at the beginning of the lamination, the temperature is kept at 30 degrees centigrade, and the pressure force exerted to the first steel plate 103 and the second steel plate 104 is 6 Mpa. At the third minute, the temperature is adjusted to 85 degrees centigrade, and the pressure force is kept at 6 Mpa. At the thirteenth minute, the temperature of the stacked structure 10 is at 85 degrees centigrade, and the pressure force reaches to 10 Mpa. From the thirteenth minute to the twenty-eighth minute, the temperature is kept at 85 degrees centigrade, and the pressure force is kept at 10 Mpa. In the twenty-eight minute, the temperature is adjusted to 145 degrees centigrade, and the pressure force is adjusted to 20 Mpa, such that at the thirty-eight minute, the temperature of the stacked structure 10 is heated to 145 degrees centigrade, and the pressure force is 20 Mpa. From the thirty-eight minute to the one hundred and eighteen minute, the temperature is kept at 145 degrees centigrade. From the thirty-eight minute to the one hundred and twenty-eight minute, the pressure force is kept at 20 Mpa. At the one hundred and eighteen minute, the temperature of the drive press is adjusted to 30 degrees centigrade, and at the one hundred and thirty-eight minute, the temperature of the stacked structure 10 is adjusted to 30 degrees centigrade. From the one hundred and eighteen minute to the one hundred and forty-three, the temperature of the stacked structure 10 is kept at 30 degrees centigrade. At the one hundred and twenty-eight minute, the pressure force of the drive press is adjusted to 6 Mpa. At the one hundred and thirty-eight minute, the pressure force of the stacked structure 10 is adjusted to 6 Mpa. Then, the pressure force of the stacked structure 10 is kept at 6 Mpa for five minutes, thereby the lamination is completed.

It is understood that because the soft temperature of each of the first buffer layer 12 and the second buffer layer 18 is smaller than 80 degrees centigrade, the first buffer layer 12 and the second buffer layer 18 begin to soft when the temperature of the stacked structure 10 is heated to 85 degrees centigrade, and is kept at 85 degrees centigrade. In addition, because the thickness of the first separate layer 11 is thinner, a portion of the first separate layer 11 above the opening 133 deforms under the help of the pressure force, and contacts the inner sidewall of the openings 133 and the electrical contact pad 122 exposed from the opening 133. Therefore, the soften first buffer layer 12 flows into the opening 133, fills the opening 133, and contacts the first separate layer 11 (see FIG. 5). Meanwhile, the first adhesive layer 112 and the second adhesive layer 131 cannot flow. When the temperature of the stacked structure 10 is heated from 85 degrees centigrade, the first adhesive layer 112 and the second adhesive layer 131 flow. Because the opening 133 is fully filled, the second adhesive layer 131 cannot flow into the opening 133 and contact the electrical contact pad 122 in the opening 133. When the temperature of the stacked structure 10 is heated to 145 degrees centigrade, the first adhesive layer 112 and the second adhesive layer 131 become hardened. Because the material of each of the first adhesive layer 112 and the second adhesive layer 131 is Epoxy-Acrylate, and the hardening temperature of each of the first adhesive layer 112 and the second adhesive layer 131 is lower than 150 degrees centigrade, an etiolating phenomenon cannot occur in the hardening process.

The second buffer layer 18 is configured for balancing the pressure force at the side of the cover film 130 and the pressure force at the side of the circuit substrate 101 further away from the cover film 130, thereby making the pressure force in the lamination uniformly distribute, and enhancing the transparency of the printed circuit board with circuit visible 100. Each of the first support layer 13 and the second support layer 18 has a stronger hardness. Therefore, the first support layer 13 supports the first buffer layer 12 to make the first buffer layer 12 flat in the lamination, and the second support layer 18 supports the circuit substrate 101 to make the second adhesive layer 131 uniformly flow in the lamination. Each of the first separate layer 11, the second separate layer 14, the third separate layer 16, and the fourth separate layer 19 are configured for preventing the two layers at two opposite sides thereof from adhering to each other.

Then, the printed circuit board with circuit visible 100 is separated from the first separate layer 11 and the third separate layer 16.

Figure 7:
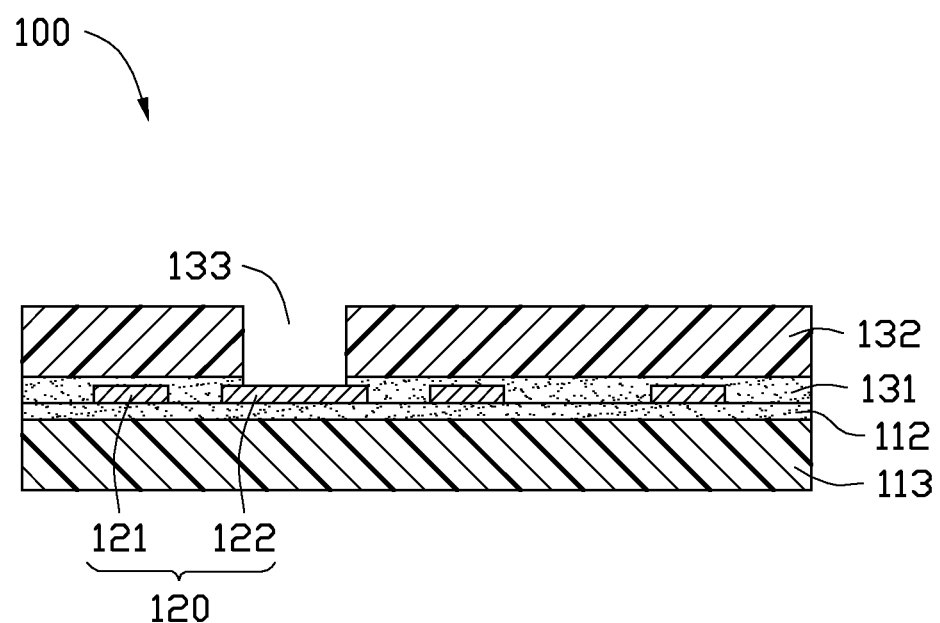
FIG. 7 shows a printed circuit board with circuit visible according to the exemplary embodiment.

FIG. 7 shows the printed circuit board with circuit visible 100. The printed circuit board with circuit visible 100 includes the circuit substrate 101 and the cover film 130 laminated onto the circuit substrate 101.

The circuit substrate 101 includes the wiring layer 120, the first adhesive layer 112, and the first dielectric layer 113. A thickness of the wiring layer 120 is in a range from 10 micrometers to 15 micrometers. The wiring layer 120 includes a plurality of wires 121 and a plurality of electrical contact pads 122. The material of the first adhesive layer 112 is Epoxy-Acrylate. The flow initiation temperature of the first adhesive layer 112 is in a range from 85 degrees centigrade to 90 degrees centigrade. In other words, when the temperature of the first adhesive layer 112 passes the flow initiation temperature of the first adhesive layer 112, the material of the first adhesive layer 112 flows. A material of the first dielectric layer 113 is polyethylene terephthalate (PET). The polyethylene terephthalate not only has better optical property and weather ability, but also has better optical transparent property. A thickness of the first adhesive layer 112 is in a range from 10 micrometers to 15 micrometers. A thickness of the first dielectric layer 113 is in a range from 40 micrometers to 60 micrometers.

The cover film 130 includes the second adhesive layer 133 and the second dielectric layer 132. The material of the second adhesive layer 133 is Epoxy-Acrylate. The flow initiation temperature of the second adhesive layer 131 is in a range from 85 degrees centigrade to 90 degrees centigrade. In other words, when the temperature of the second adhesive layer 131 passes the flow initiation temperature of the second adhesive layer 131, the second adhesive layer 112 flows. The hardening temperature of the second adhesive 131 is smaller than 150 degrees centigrade. The material of the second dielectric layer 132 is polyethylene terephthalate. The thickness of the second adhesive layer 131 is larger than the thickness of the copper foil layer 111. The thickness of the second adhesive layer 131 is in a range from 12 micrometers to 18 micrometers. The thickness of the second dielectric layer 132 is in a range from 40 micrometers to 60 micrometers.

A plurality of openings 133 spatially corresponding to the electrical contact pads 122 is formed in the cover film 130. The cover film 130 is laminated onto the wiring layer 120. Each of the electrical contact pads 122 is exposed outside from the corresponding opening 133.

In the method for manufacturing the printed circuit board with circuit visible, because the dielectric layer is made of polyethylene terephthalate, and the adhesive layer is made of Epoxy-Acrylate, the adhesive layer can be solidified under a lower temperature. An etiolating phenomenon thus cannot occur in the hardening process, and the transparency of the printed circuit board with circuit visible.

While certain embodiments have been described and exemplified above, various other embodiments will be apparent from the foregoing disclosure to those skilled in the art. The disclosure is not limited to the particular embodiments described and exemplified but is capable of considerable variation and modification without departing from the scope and spirit of the appended claims.

What is claimed is:

1. A method for manufacturing a printed circuit board with circuit visible, comprising:
   providing a copper-clad laminate, the copper-clad laminate comprising a copper foil layer, a first adhesive layer, and a first dielectric layer, which are stacked in described order, a flow initiation temperature of the first adhesive layer being in a range from 85 degrees centigrade to 90 degrees centigrade, and a hardening temperature of the first adhesive being lower than 150 degrees centigrade;
   converting the copper foil layer into a wiring layer to obtain a circuit substrate, the wiring layer comprising at least one electrical contact pad;
   laminating a cover film on a side of the wiring layer of the circuit substrate, the cover film comprising a second adhesive layer and a second dielectric layer, the second adhesive layer contacting the circuit substrate, the cover film having at least opening spatially corresponding to the electrical contact pad, arranging a first separate layer and a first buffer layer on a side of the cover film, the first separate layer being sandwiched between the cover film and the first buffer layer, arranging a third separate layer and the second buffer layer on the side of the wiring layer, thereby obtaining a stacked structure, a flow initiation temperature of the second adhesive layer being in a range from 85 degrees centigrade to 90 degrees centigrade, a hardening temperature of the second adhesive being smaller than 150 degrees centigrade, and a soft temperature of a material of each of the first buffer layer and the second buffer layer being lower than 80 degrees centigrade, and
   laminating the stacked structure, the temperature of the stacked structure being first controlled to make the first buffer layer soft, the first separate layer contacting the inner sidewall of the opening, thus enabling the softened first buffer layer to fill the opening, then the temperature of the lamination being controlled to make the first adhesive layer and the second adhesive layer be solidified, thereby obtaining a printed circuit board with circuit visible.

2. The method of claim 1, wherein a material of each of the first dielectric layer and the second dielectric layer is polyethylene terephthalate, and a material of each of the first adhesive layer and the second adhesive layer is Epoxy-Acrylate.

3. The method of claim 2, wherein a material of the first buffer layer and the second buffer layer is high density polyethylene, and a soft temperature of each of the first buffer layer and the second buffer layer is in a range from 75 degrees centigrade to 78 degrees centigrade.

4. The method of claim 3, wherein each of the first separate layer and the second separate layer is a release film made of polyethylene terephthalate.

5. The method of claim 4, wherein a thickness of each of the first buffer layer and the second buffer layer is in a range from 180 micrometers to 200 micrometers, and a thickness of each of the first separate layer and the second separate layer is in a range from 20 micrometers to 25 micrometers.

6. The method of claim 4, wherein the stacked structure further comprises a first support arranged at a side of the first buffer layer further away from the first separate layer, and a first steel plate, a material of the first support layer is polyethylene terephthalate, and a thickness of the first support layer is in a range from 40 micrometers to 60 micrometers.

7. The method of claim 4, the stacked structure further comprises a second support sandwiched between the third separate layer and the second buffer layer, a third separate layer arranged at a side of the second buffer layer further away from the second support layer, and a second steel plate, a material of the second support layer is polyethylene terephthalate, and a thickness of the second support layer is in a range from 40 micrometers to 60 micrometers.

8. The method of claim 1, wherein in the lamination, a maximum value of the temperature is lower than 150 degrees centigrade, and a maximum value of the pressure force is 20 Mpa.

* * * * *